May 19, 1959 A. STEVENSON 2,887,415

METHOD OF MAKING ALLOYED JUNCTION IN A SILICON WAFER

Filed May 12, 1955

INVENTOR.
ALDEN STEVENSON

BY Irvin M. Haugen

ATTORNEY

United States Patent Office 2,887,415

Patented May 19, 1959

2,887,415

METHOD OF MAKING ALLOYED JUNCTION IN A SILICON WAFER

Alden Stevenson, Excelsior, Minn., assignor to Minneapolis-Honeywell Regulator Company, Minneapolis, Minn., a corporation of Delaware Application May 12, 1955, Serial No. 507,893

2 Claims. (Cl. 148—1.5)

The present invention relates to an improved semiconductor asymmetrical conducting device and to the method of preparing the same. More specifically, the invention relates to an improved unipolar type of transistor or semiconductor amplifier having an improved junction area configuration. The present invention is an improvement over the devices as proposed by W. Shockley as reported in Proceedings of the IRE, vol. 40, pages 1365–1376, November 1952. The procedures and devices produced in accordance with the present invention may of course be suitably applied to other types of transistors as well. Although these devices may be fabricated of various semiconductor materials such as germanium, it is preferable to construct the device of silicon.

Presently, unipolar semiconductor devices are known; however, the devices of the present invention provide improved electrical characteristics over those possible with the devices currently available. Unipolar transistor devices made in accordance with the present invention are characterized by very high input impedances facilitating power matching to signal sources and RC coupling between amplifier stages, better temperature stability as well as a higher maximum operable temperature, better uniformity of gain with temperature and signal amplitude, and better high frequency response.

Heretofore, it has been proposed to form p-n junction areas from a source which is in planar surface contacting form, however, I have found that superior junctions particularly in connection with unipolar devices can be formed by diffusion or alloying from an impurity source having a generally cylindrical configuration, such as is obtained with a length of wire. In this connection, the junction is formed by the alloying of such an impurity into a semiconductor body with the impurity source positioned relative to the body so that, as the alloying procedure or cycle progresses, the area of contact between the impurity body and the semiconductor wafer body gradually increases. It is believed that the improved electrical characteristics are achieved because of the superior junction areas which are provided in the devices produced in accordance with the present invention.

Briefly, the device is formed from a single crystalline ingot or wafer of a semiconductor substance preferably silicon which has a certain resistivity and conductivity type. If, for example, a unipolar type transistor is to be produced, the device is provided with a pair of ohmic contact areas designated "source" and "drain" and is further provided with at least one diffused or alloyed p-n junction area which is disposed between the source and drain contacts, has a conductivity type opposite that of the wafer, and is designated "gate." Low resistance contact is made to the wafer through the source and drain and the relative conductance between these contacts is controlled by the potential applied to the gate area.

The device is symmetrical in its electrical operation. The gate will control current flow in either direction, that is, from source-to-drain or from drain-to-source. It is seen therefore, that circuit wise, the device has wide application because of its electrical characteristics including symmetry, high input impedance, high temperature stability, and other desirable features.

The use of silicon in a unipolar transistor presents certain advantages as set forth above including higher maximum operating temperature as well as improved uniformity of gain with temperature, however, the use of silicon also presents additional problems of fabrication since it is much more difficult to work with. The present invention lies at least in part in providing expedients in techniques of fabrication of silicon devices thereby making devices of this type possible to produce.

Therefore, it is an important object of the present invention to provide a unipolar transistor device having a silicon body member.

It is an object of the present invention to provide an improved asymmetrical conducting apparatus including a semiconductor wafer with improved junction areas.

It is a further object of the present invention to provide an improved gate junction for use in connection with unipolar type transistor devices.

It is still a further object of the present invention to provide an improved unipolar transistor having improved electrical characteristics.

Other further objects will become apparent upon a reading of the following specification, with reference to the appended drawings in which.

In the preferred modification of the present invention, a single crystalline wafer of substantially pure silicon is prepared. Normally, it is preferable to use silicon which has an impurity content of about one part impurity in $10^6$ to $10^7$ parts, this material being either of n-type or p-type conductivity. Material having such a composition is available commercially. The resistivity of the semiconductor material when in single-crystalline form ranges between 15 and 40 ohm-centimeters, however, material having a resistivity of between 25 and 30 ohm-centimeters is preferred. After preparation of a single crystalline ingot having the desired conductivity type and resistivity, a plurality of dice or wafers of desired configuration are cut from the ingot.

The ingot is normally prepared from a melt having the proper amount of impurity to form an ingot of desired resistivity. When silicon having this high purity is used, the material has a resistivity of from 25 to 30 ohm-centimeters and normally exhibits n-type conductivity. If p-type conductivity is desired, an acceptor impurity such as aluminum, indium or the like is added to the melt in proper amounts to obtain the desired resistivity. The thickness of the wafer or dice 11 is rather critical with respect to the device, and particularly to the alloying cycle utilized, and, in this connection, a wafer having a size of about ¼ x ¼ x 0.008 inch has been found desirable.

Figure 1:
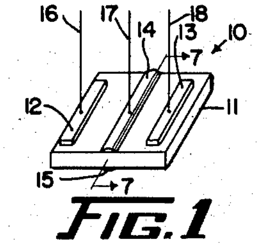
Figure 1 is a perspective view of a device produced in accordance with the preferred modification of the present invention.
Figure 2:
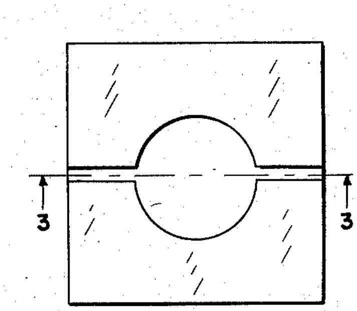
Figure 2 is a top plan view of a jig which is adapted to retain the various individual components of the device of the present invention while being formed.
Figure 3:
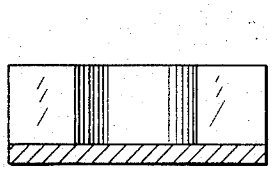
Figure 3 is a vertical sectional view taken along the lines in the direction of the arrows 3—3 of Figure 2.
Figure 7:
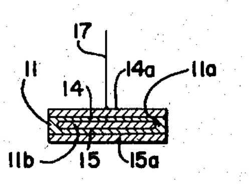
Figure 7 is a sectional view taken through the junction zone of the device, along the lines and in the direction of the arrows 7—7 of Figure 1.

Although the 8 mil thickness dimension is preferred, thicknesses ranging between 5 and 15 mils are normally useful with my alloying techniques. In the wafer, a crystal orientation having the major faces parallel to the (111) plane is generally preferred. After rough preparation of the dice or wafers, final operations such as lapping and etching are carried out to obtain material having the desired dimensions. It is preferable to etch these wafers or dice with an etch having a composition including hydrofloric acid, acetic acid, nitric acid, and an oxidizing agent such as bromine such as, for example, that solution disclosed and set forth in Patent No. 2,619,414 to Heindenreich. Of course, other similar etching solutions may be satisfactorily utilized, this not being critical. After etching, the gate junctions 14 and 15 are prepared, these being alloyed into the wafer, the alloying operation being carried out in suitable boats or jigs in accordance with the methods as outlined in more specific detail below. After preparation of the gate junction or junctions, the source and drain junctions 12 and 13 respectively are prepared, the leads 16, 17, and 18 attached, after which the unit is given a final etch. Since the junction area envelopes the wafer, as shown in Figure 7, a single lead to the gate is therefore adequate. The device is then ready for operation; however, it is generally preferable to encapsulate the unit so as to avoid contamination in subsequent operation.

Figure 4:
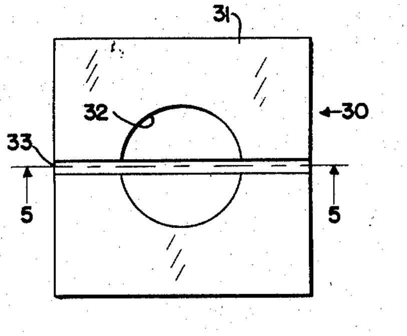
Figure 4 is a top plan view of a slightly modified form of jig adapted to retain various components of the device while in process.
Figure 6:
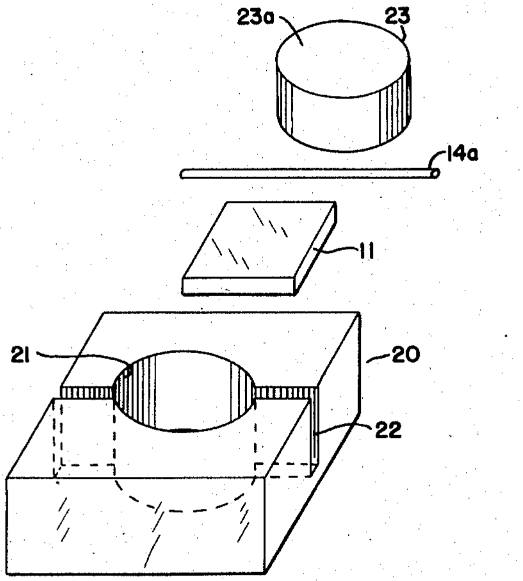
Figure 6 is an exploded perspective view showing one operation in the production of the units of the present invention.
Figure 5:
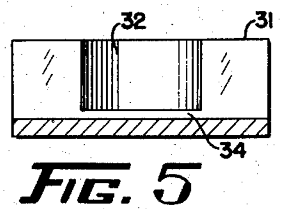
Figure 5 is a vertical sectional view taken along the lines and in the direction of the arrows 5—5 of Figure 4.

The preparation of the gate junctions is preferably accomplished with various components held in relative relationship in suitable jigs or boats such as those disclosed in Figures 2–6 of the drawings. Attention is directed to Figure 6 wherein there is disclosed a boat 20 having a cavity 21 formed therein which is adapted to receive the silicon semiconductor wafer 11. Means such as a slot 22 are also provided for receiving the impurity source **14*a* in the form of a length of wire and maintaining it in contacting relationship with a surface of the wafer 11. A cylindrical plug 23 having a planar surface such as 23*a* for pressing against the impurity source 14*a* is provided to force the impurity source 14*a* against the top surface of the wafer 11. When it is desirable to place a corresponding junction such as the junction 15 which is preferably in oppositely disposed relationship to junction 14 on the wafer, a second jig or boat such as that disclosed in Figures 4 and 5 is provided. In this connection, the boat 30 comprises a graphite block 31 having a bore or cavity 32 therein. In addition, a slot 33 is provided which undercuts the bore 32 by a slight distance as shown at 34. This slight undercut permits the previously applied impurity body 14*a* to be received therein, and the remainder of the wafer 11** may then be supported throughout a substantial extent of its area. After the various members have been placed within the proper jig or boat, the unit is placed in a treating zone such as a furnace or the like which is preferably provided with a non-oxidizing atmosphere such as helium, hydrogen, nitrogen or the like, and the heat is then raised to slightly above the melting temperature of the impurity source and maintained at that level for a certain interval of time until the alloying cycle is complete. Among the impurity sources suitable for use in connection with n-type silicon semiconductor wafers are electron acceptor materials such as aluminum, gold-gallium alloy, or gold-indium alloy. When aluminum is utilized in connection with wafers having a thickness in the range of 8 mils, an alloying cycle utilizing a temperature of 750° C. for a period of from 5 to 15 minutes is generally preferred. If desired, other temperatures may be utilized such as in the range from 700 to 850° C for correspondingly longer or shorter periods of time such as the geometry of the device requires. It has been found that the performance of the units is substantially enhanced when the gate junction is alloyed into the semiconductor wafer in such a manner that the area of contact is gradually increased throughout the alloying cycle. In this connection, round wire of a relatively small diameter may be used. For a unit of the size ¼ inch x ¼ inch x 8 mils, an aluminum wire having a diameter of about 10 mils is preferred. During the alloying or diffusion cycle, the alloying is initiated with the impurity in contact with the wafer across a fairly limited area. As this cycle continues, the area of contact gradually increases throughout the entire alloying cycle. Under these circumstances, it has been found that the wire maintains its identity to a certain degree even after the alloying cycle has been concluded, however the round configuration will normally flatten to a somewhat eliptical shape during the alloying cycle. Such a configuration for the impurity source tends to lessen the internal strains set up during the alloying cycle, and there is consequently less danger of cracking the wafer due to these strains.

After completion of the requisite operations for preparing the gate junctions, the wafer is ready for application of source and drain junctions which are prepared from material which is lower melting than the gate. These junctions are of the low resistance type and generally can be applied to the wafer by any suitable well-known manner such as by vapor diffusion, evaporation, electrode position, soldering or the like. In this connection, I have found it desirable to diffuse the source and drain junctions into the semiconductor wafer from a block situated at the desired location on the wafer surface, thus preparing a mechanically and electrically sound contact. The material used for diffusion is preferably of the same conductivity type as the base wafer, for example with an n-type or electron donor type wafer the source and drain junction will normally comprise an alloy including a small quantity of an n-type doping material such as arsenic, antimony, phosphorous or the like carried in a suitable contact material such as gold. When a gold-antimony alloy of the composition 98%–99% gold, balance antimony is used, a diffusion temperature of 500° C. for a period of from 5 to 15 minutes is generally sufficient for preparation of a suitable contact. The goal silicon eutectic mixture has a melting point of about 370° C. and heat is generally applied until the gold begins to melt and fuse with the silicon. At 500° C. this normally occurs within a period of less than 5 minutes and thus the period of from 8 to 10 minutes is generally satisfactory. Since no p-n electrical junction is being fabricated at this point, the diffusion depth is not extremely critical except that the gold alloy should not be allowed to diffuse into the gate region.

The device is now ready for application of electrode lead wires or contacts, and this is done by merely soldering contacts such as the contacts 16, 17, and 18 to the various electrodes. This operation is quite simple in connection with the gold alloy but is somewhat more difficult in connection with the aluminum which is a difficult material to solder to. Therefore, I have found it desirable to copper plate the aluminum directly with a copper electroplating solution after which soldering can be readily accomplished to the exposed copper surface. At this point the device is masked with an acid resisting masking material over all its surface with the exception of the junctions, and the device is then etched in order to avoid surface leakage from the contact areas. An additional etching step may be carried out subsequent to the forming of the junction zones and source and drain contacts, but prior to the application of the lead elements to the various electrode members. This etching also reduces the possibility of surface leakage.

For purposes of uniformity and reproducibility of characteristics from one unit to another, it is desirable that the gate junction include a pair of oppositely disposed portions which are situated in proper relationship to one another. In Figure 7, there is shown the cross section of a typical unit having a pair of junction areas 14 and 15, wherein the entire alloyed area designated **11*a* circumscribes the non-alloyed portion 11*b* of the wafer 11**. While the alloying operation is in progress, the impurity source being longer than the width of the wafer will sag into contact with the edge surfaces of the device and alloy into these areas as well. When the alloying is carried out in this fashion and in the jigs as shown in Figures 2–5 of the drawings, units of uniform and reproducible characteristics are produced.

Although various specific modifications of the present invention have been disclosed herein it is to be understood that these are for the purpose of illustration only and there is no intent to limit the scope of the invention otherwise than necessitated by the scope of the appended claims. It will be obvious to those skilled in the art that various modifications of the present invention may be made without departing from the spirit of the present invention.

I claim:

1. The method of forming an alloyed junction area in a wafer of single-crystalline silicon semiconductor material of n-type conductivity which includes placing an elongated impurity source body selected from the class consisting of aluminum, gold-gallium alloy and gold-indium alloy and having a substantially circular cross-section adjacent to and in contact with a surface of said wafer, the elongated axis of said impurity source body being arranged parallel to said contacting surface, passing said wafer and impurity source combination through a heating zone wherein the temperature is elevated to a temperature exceeding the fusion point of said impurity source body, and then urging said impurity source body against said semiconductor body as fusion proceeds, thereby increasing the area of contact between said wafer and said impurity source, and maintaining said elevated temperature until alloying is achieved between said impurity source and said semiconductor material.

2. The method of forming an alloyed junction in a wafer of substantially single-crystalline silicon having n-type conductivity which includes placing an elongated aluminum impurity source body having a substantially circular cross-section adjacent to and in contact with said wafer, the elongated axis of said source being arranged parallel to the contacting surface, passing said wafer and impurity source combination through a heating zone wherein the temperature is elevated to a level exceeding the fusion point of said impurity source, and then urging said aluminum impurity source against said silicon semiconductor body as fusion proceeds, thereby increasing the area of contact between said silicon semiconductor body and said aluminum impurity source and maintaining said elevated temperature until alloying is achieved between said impurity source and said semiconductor material.

References Cited in the file of this patent

UNITED STATES PATENTS

| | | |
|---|---|---|
| 2,561,411 | Pfann | July 24, 1951 |
| 2,597,028 | Pfann | May 20, 1952 |
| 2,697,052 | Dacey et al. | July 24, 1954 |
| 2,705,767 | Hall | Apr. 5, 1955 |
| 2,721,965 | Hall | Oct. 25, 1955 |